United States Patent
Kikkawa et al.

(10) Patent No.: US 7,638,819 B2
(45) Date of Patent: Dec. 29, 2009

(54) COMPOUND SEMICONDUCTOR DEVICE AND THE FABRICATING METHOD OF THE SAME

(75) Inventors: Toshihide Kikkawa, Kawasaki (JP); Kenji Imanishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/181,730

(22) Filed: Jul. 15, 2005

(65) Prior Publication Data
US 2006/0102926 A1 May 18, 2006

(30) Foreign Application Priority Data
Nov. 16, 2004 (JP) ............................. 2004-332284

(51) Int. Cl.
H01L 29/778 (2006.01)
(52) U.S. Cl. .................. 257/194; 257/E29.246; 257/E21.403; 257/27; 257/24
(58) Field of Classification Search ................ 257/194, 257/13, 24, E29.246, E21.403, 27
See application file for complete search history.

(56) References Cited

U.S. PATENT DOCUMENTS

| | | | |
|---|---|---|---|
| 5,739,554 A * | 4/1998 | Edmond et al. | 257/103 |
| 5,990,495 A * | 11/1999 | Ohba | 257/94 |
| 6,064,082 A * | 5/2000 | Kawai et al. | 257/192 |
| 6,441,391 B1 | 8/2002 | Ohno et al. | 257/11 |
| 2003/0020092 A1 * | 1/2003 | Parikh et al. | 257/192 |
| 2003/0102482 A1 * | 6/2003 | Saxler | 257/85 |
| 2003/0107065 A1 | 6/2003 | Taniguchi et al. | 257/289 |
| 2003/0201459 A1 | 10/2003 | Sheppard et al. | 257/194 |
| 2003/0218183 A1 * | 11/2003 | Micovic et al. | 257/192 |
| 2004/0195562 A1 | 10/2004 | Munns | 257/1 |
| 2006/0073621 A1 * | 4/2006 | Kneissel et al. | 438/21 |
| 2006/1007362 * | 4/2006 | Kneissel et al. | 438/21 |

FOREIGN PATENT DOCUMENTS

| | | |
|---|---|---|
| JP | 09-083016 | 3/1997 |
| JP | 10-294452 | 11/1998 |
| JP | 11-204885 | 7/1999 |
| JP | 2000-068498 | 3/2000 |
| JP | 2000-106365 | 4/2000 |
| JP | 2000-228535 | 8/2000 |
| JP | 2002-76329 | 3/2002 |
| WO | WO 02/48434 | 6/2002 |

OTHER PUBLICATIONS

Saarinen, K. et al., Observation of Native Ga Vacancies in GaN by Positron Annihilation, Physical Review Letters, vol. 79, No. 16, Oct. 20, 1997.*

(Continued)

Primary Examiner—David Vu
Assistant Examiner—Earl N Taylor
(74) Attorney, Agent, or Firm—Kratz, Quintos & Hanson, LLP

(57) ABSTRACT

A GaN layer functions as an electron transit layer and is formed to exhibit, at least at a portion thereof, A/B ratio of 0.2 or less obtained by a photoluminescence measurement, where "A" is the light-emission intensity in the 500-600 nm band, and "B" is the light-emission intensity at the GaN band-edge.

7 Claims, 10 Drawing Sheets

OTHER PUBLICATIONS

Xing, H. et al., Gallium Nitride Based Transistors, Journal of Physics: Condensed Matter, vol. 13, Jul. 26, 2001.*

Armitage, R., et al. Electrical and Optical Properties of Carbon-Doped GaN Grown by MBE on MOCVD GaN Templates Using a CCl4 Dopant Source, 2002 MRS Spring Meeting, Apr. 2-5, 2002.*

Armitage, R. et al. Contributions from Gallium Vacancies and Carbon-Related Defects to the "Yellow Luminescence" in GaN, Applied Physics Letters, vol. 82, No. 20, May 19, 2003.*

Ogino, T. and Masaharu, A., Mechanism of Yellow Luminescence in GaN, Japanese Journal of Applied Physics, vol. 19, No. 12, Dec. 1980, pp. 2395-2405.*

Reshchikov, M. A. And Korotokov, R. Y., Analysis of the temperature and excitation intensity dependencies of photoluminescence in undoped GaN films, Physical Review B, vol. 64, Aug. 29, 2001, pp. 115205.*

Aktas et al. (Microwave Performance of AlGaN/GaN Inverted MODFET's, IEEE Electron Device Letters, vol. 18, No. 6, Jun. 1997).*

Japanese Office Action dated Aug. 5, 2008.

European Search Report dated Mar. 6, 2009.

* cited by examiner

COMPOUND SEMICONDUCTOR DEVICE AND THE FABRICATING METHOD OF THE SAME

CROSS-REFERENCE TO RELATED APPLICATIONS

This application is based upon and claims the benefit of priority from the prior Japanese Patent Application No. 2004-332284, filed on Nov. 16, 2004, the entire contents of which are incorporated herein by reference.

BACKGROUND OF THE INVENTION

1. [Field of the Invention]

The present invention relates to a compound semiconductor device having a transistor configuration which includes a buffer layer containing GaN and the fabricating method of the same.

2. [Description of the Related Art]

Amplifiers for the base-stations for recent portable phones are required to operate at high voltages and thus they must exhibit excellent withstand voltages. As electronic devices for achieving excellent withstand voltages, there have been actively developed compound semiconductor devices having a HEMT-configuration employing sapphire, SiC, GaN, Si or the like as a substrate, GaN as an electron transit layer and AlGaN as an electron supply layer (hereinafter, referred to as GaN-HEMTs). For example, Japanese Patent Application Laid-open No. 2000-106365 discloses a technique in which an AlN layer or an AlGaN layer is formed under a gate electrode to improve the interface state. GaN has a band gap of 3.4 eV, which is significantly larger than that of GaAs of 1.4 eV. A GaN-HEMT can create an amount of 2-dimension electron gas which is about ten times compared with a so-called GaAs-HEMT. Therefore, GaN-HEMTs are expected as electronic devices having withstand voltages largely exceeding those of GaAs-HEMTs. At the present time, it has been reported that GaN-HEMTs can exhibit withstand voltages higher than 200V under the current-off state.

FIG. 11 illustrates an example of the configuration of a conventional GaN-HEMT.

In the GaN-HEMT, an AlN layer 102 and a GaN layer 103 are laminated in order, for example, on a SiC substrate 101 to form a buffer layer. Further, an n-type AlGaN layer 105 is laminated on the GaN layer 103. A gate electrode 106 which is Schottky-connected to the AlGaN layer 105, and a source electrode 107 and a drain electrode 108 which are spaced apart from the both sides of the gate electrode 106 on the AlGaN layer 105 and are ohmic-connected thereto are formed by pattern formation. Further, a SiN layer 9 as a protective insulating film is laminated between the source electrode 107 and the drain electrode 108 on the AlGaN layer 105. Thus, a GaN-HEMT is configured.

However, in the case of using a GaN-HEMT as an electronic device having high withstand voltage, there is a problem that the characteristics thereof vary largely. For example, FIG. 12 illustrates the relationship between the time and the output value when a conventional GaN-HEMT is continuously used.

Thus, as a GaN-HEMT is used a number of times, the output value thereof is decreased to about 70% of the initial value after continuous use thereof, for example, for 15 years. The reduction of the output value by about 30% after a lapse of 15 years can not be said to be sufficiently practical, and thus conventional GaN-HEMTs can be considered to have a significant problem in this regard.

SUMMARY OF THE INVENTION

The present invention was made in views of the aforementioned problems and aims at providing a highly reliable compound semiconductor device which exhibits extremely small variations in the characteristics and small degradation with a lapse of time.

The compound semiconductor device according to the present invention is a compound semiconductor device having a transistor configuration and includes a substrate, a buffer layer formed on the substrate and an electron supplying layer containing AlGaN formed on the buffer layer 3, wherein the buffer layer is formed by laminating a first buffer layer containing AlN, a second buffer layer containing GaN and a third buffer layer containing AlGan and provided between the first buffer layer and the second buffer layer.

Here, the second buffer layer is formed, at least at one portion thereof, so as to exhibit A/B ratio (hereinafter, referred to as the light-emission peak intensity) of 0.2 or less obtained by photoluminescence measurement, where "A" is the maximum light-emission intensity value in the 500-600 nm band, and "B" is the light-emission intensity at the GaN band-edge.

The fabricating method of a compound semiconductor device according to the present invention includes the steps of forming a buffer layer on a substrate and forming an electron supplying layer containing AlGaN on the buffer layer, wherein the buffer layer is formed by continuously laminating a first buffer layer containing AlN and a second buffer layer containing GaN in order and, when the second buffer layer is formed, the growing rate is set to a value within the range of 0.1 nm/second to 1 nm/second and the V/III ratio is set to a value within the range of 10000 to 100000, respectively.

Here, the second buffer layer, at least at one portion thereof, exhibits A/B ratio of 0.2 or less obtained by photoluminescence measurement, where "A" is the maximum light-emission intensity value in the 500-600 nm band, and "B" is the light-emission intensity at the GaN band-edge.

Preferably, the buffer layer is formed by forming a third buffer layer containing an AlGaN layer between the first buffer layer and the second buffer layer.

DETAILED DESCRIPTION OF THE PREFERRED EMBODIMENTS

The Basic Skeleton of the Present Invention

The present inventors focused attention on the phenomenon of output drift during power-operation of a GaN-HEMT, in order to easily grasp, in a short time, changes in the characteristics of a GaN-HEMT which appear as degradation of output value with a lapse of time. Such changes become prominent at the instant of turning off the power-operation of a GaN-HEMT in particular.

Figure 1:
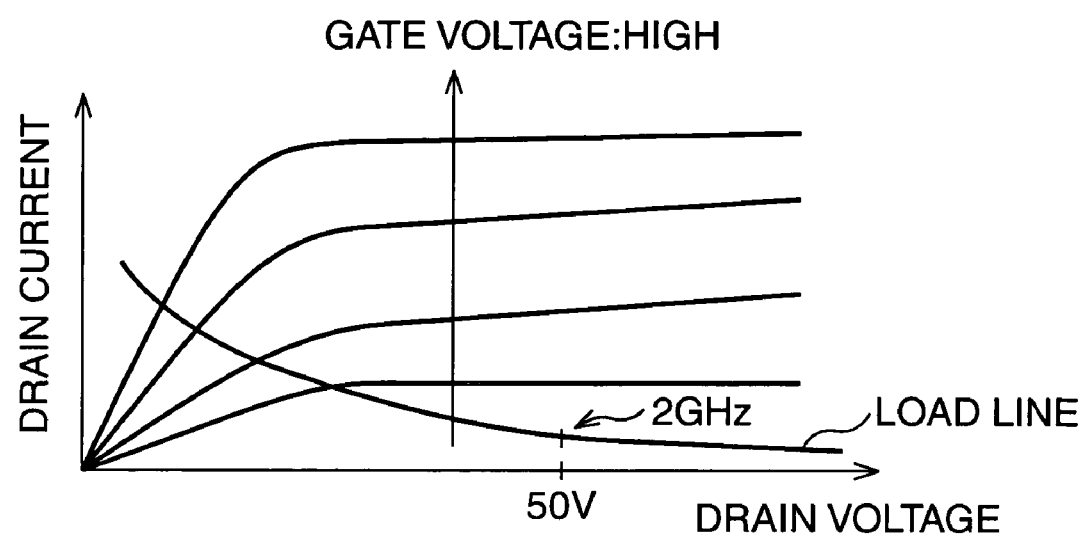
FIG. 1 is a characteristic view illustrating the current-voltage characteristic curve of a GaN-HEMT.

FIG. 1 illustrates the current-voltage characteristic curve of a GaN-HEMT.

Here, the horizontal axis represents the drain (drain-source) voltage and the vertical axis represents the drain (drain-source) current. The greater the voltage applied to the gate electrode (the gate voltage), the greater the drain current for the same drain voltage. In the case where the GaN-HEMT is used with an amplifier for a base station, the drain voltage is about 50V. Therefore, the drain voltage is set to 50V and a high-frequency signal at 2 GHz, for example, is input to the GaN-HEMT (the power operation is turned on) for flowing a slight drain current. In this case, the output of the GaN-HEMT changes so as to draw a curve (a load line) as illustrated.

Figure 2:
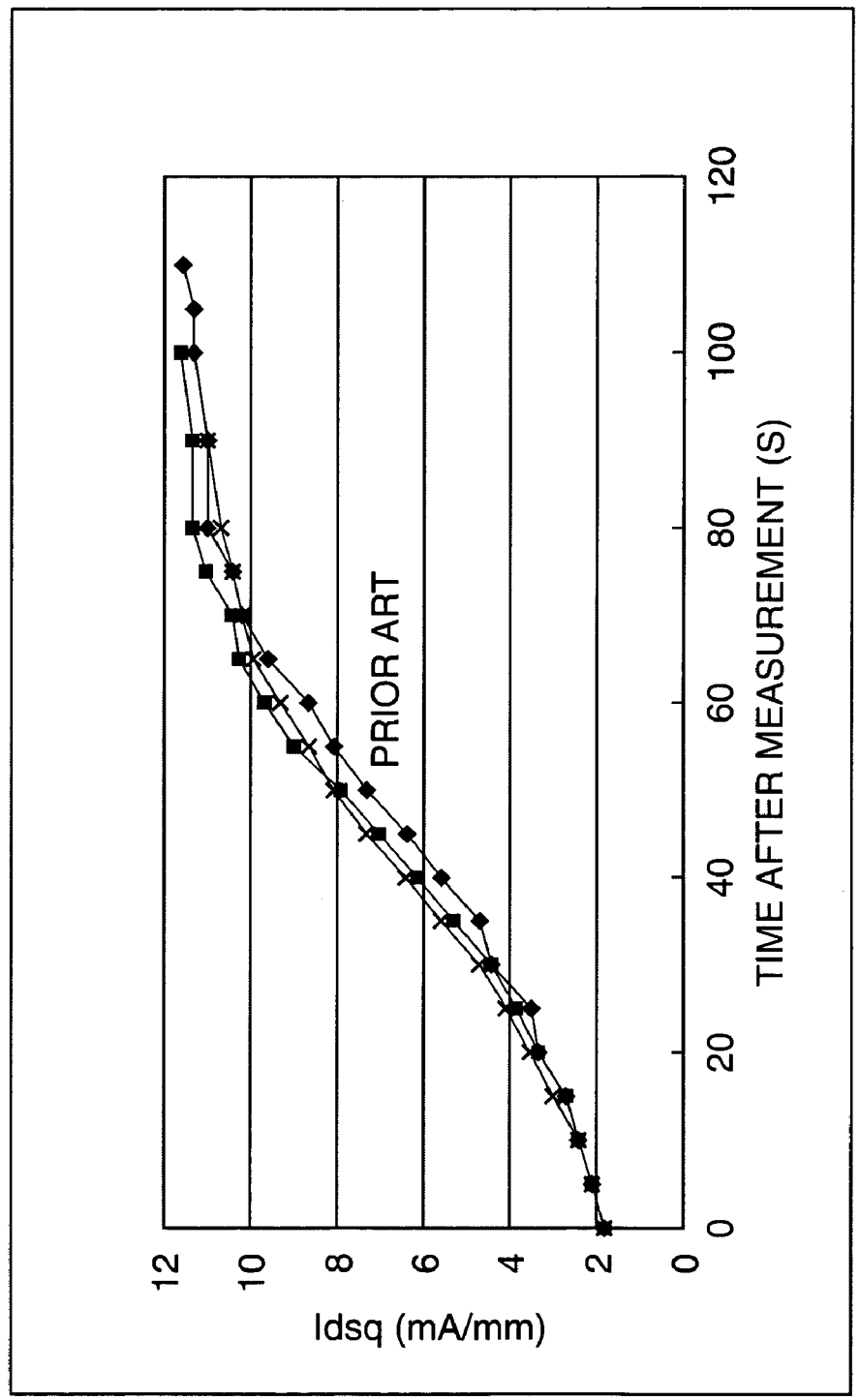
FIG. 2 is a characteristic view illustrating monitored slight drain currents which flowed at the instant of turning off the power-operation of a conventional GaN-HEMT.

FIG. 2 illustrates monitored slight drain currents which flowed at the instant of turning off the power-operation of a conventional GaN-HEMT.

Here, the horizontal axis represents the measuring time (second) and the vertical axis represents the drain current value (bias-point current: mA/mm) at the instant of turning off the power-operation of the GaN-HEMT. The number of measurements was three.

Figure 12:
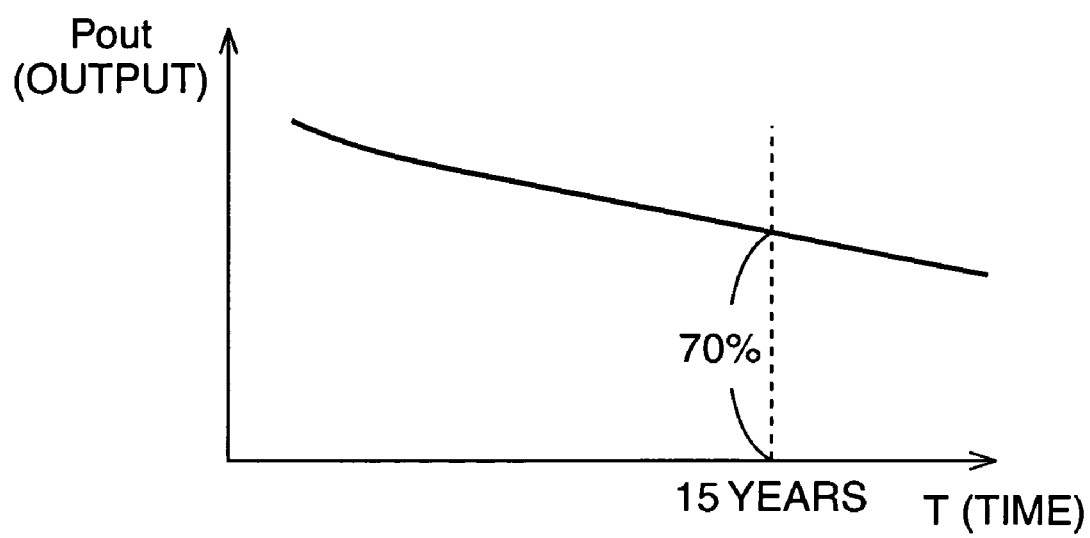
FIG. 12 is a characteristic view illustrating the relationship between the time and the output value when the conventional GaN-HEMT is continuously used.

As illustrated in the figure, there was observed a transient response characteristic in which, just after turning off the power operation, the bias-point current decreased to about 10% of that before the power operation and it took a long time interval of one minute or more to restore that. Whether the time required for restoring the current drift in such a response characteristic is long or short can be regarded as the fact evaluating whether the degradation in the output value with a lapse of time in FIG. 12 is large or small in a short period of time. Hereinafter, this response characteristic will be employed as an indicator of the degradation with a lapse of time in the output value. As a permissible value of degradation with a lapse of time in the output value, about 5% or less of the initial value after a lapse of 15 years is sufficient, and when this is applied to the current-drift restoring time, it is about 10 seconds. Therefore, when the response characteristic is used as an indicator of the degradation with a lapse of time in the output value, a restoring time of 10 seconds or less is favorable, and the restoring time of 10 seconds is used as the reliability specification.

Figure 11:
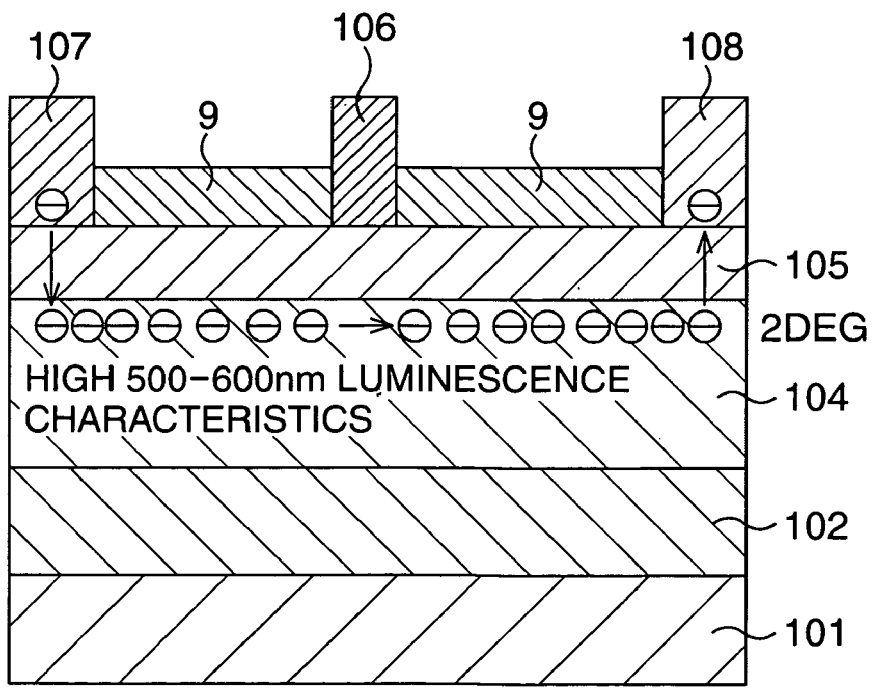
FIG. 11 is a schematic cross sectional view illustrating the configuration of the conventional GaN-HEMT.

As illustrated in the aforementioned FIG. 11, for example, in a GaN-HEMT, by controlling the gate voltage applied to the gate electrode 106, 2-dimension electron gas (2DEG) moves through the GaN layer 104 as an electron transit layer between the source electrode 107 and the drain electrode 108, and this movement causes predetermined outputs. The greater the amount of 2-dimension electron gas at the region beneath the gate electrode 106 at the interface of the GaN layer 104 with the AlGaN layer 105 which lies, the greater the obtained output. Therefore, it can be considered that the main reason for occurrence of the transient response characteristic as illustrated in FIG. 2 is that 2-dimension electron gas is trapped to portions of the GaN layer 104 other than the interface thereof with the AlGaN layer 105 and thus it is prevented from moving, thereby decreasing the amount of 2-dimension electron gas existing beneath the gate electrode 106.

The present invention utilizes the so-called photoluminescence measurement method as the method for quantitatively estimating whether the amount of 2-dimension electron gas is large or small, and particularly focuses attention on the light-emission intensity in the 500-600 nm band.

When taking FIG. 11 as an example for convenience of explanation, the photoluminescence measurement method is a procedure which applies short-wavelength light to the surface of the AlGaN layer 105 in a detection sample in which the AlGaN layer 105 has been formed, namely the gate electrode 106, etc., has not been formed, and then measures intensity of light emitted from the detection sample.

Figure 3:
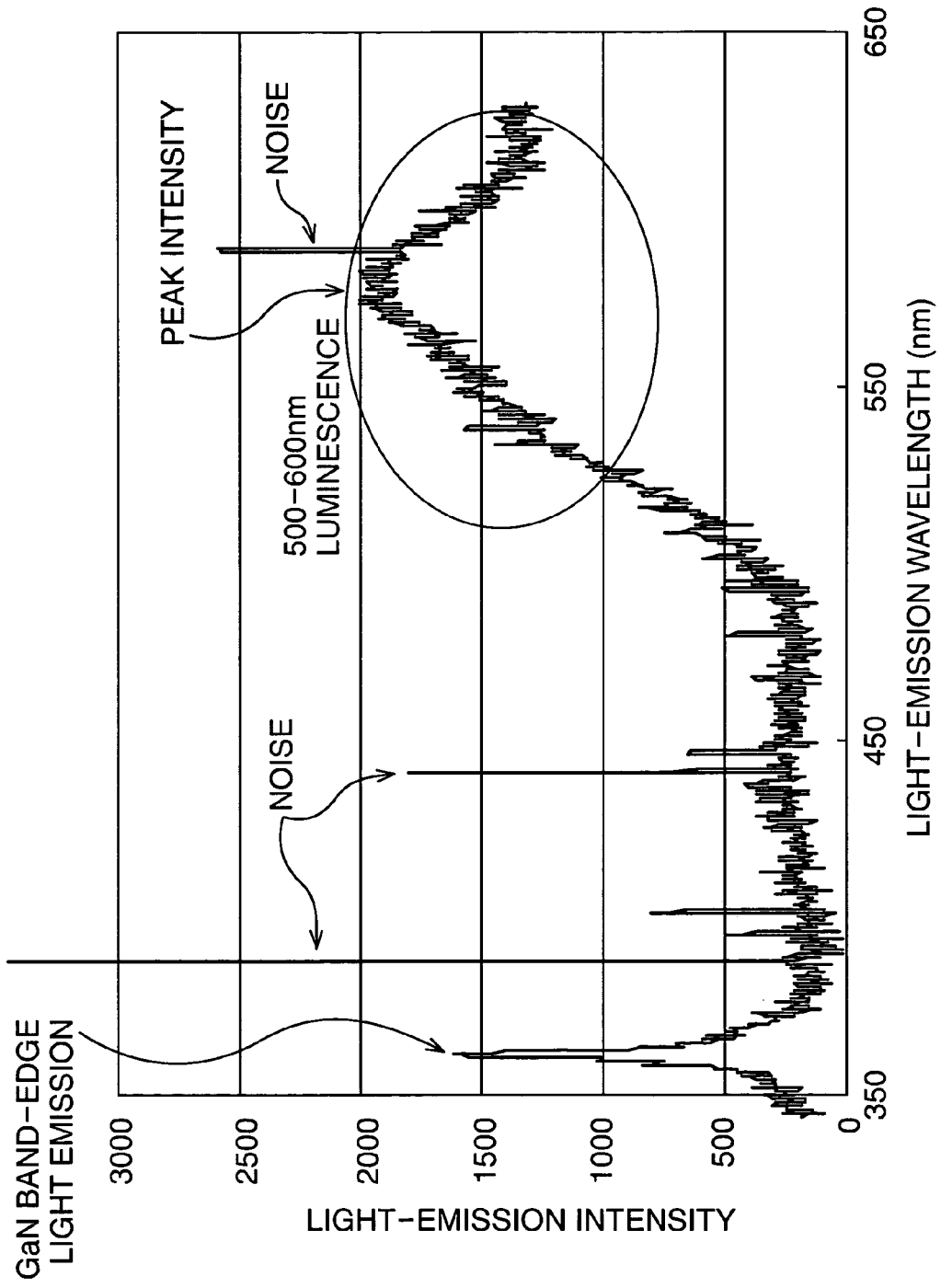
FIG. 3 is a characteristic view illustrating the relationship between the light-emission wavelength and the light-emission intensity obtained by the photoluminescence measurement method, when a conventional GaN-HEMT (the AlGaN layer and the GaN layer thereof) was used as the detection sample.

FIG. 3 is a characteristic view illustrating the relationship between the light-emission wavelength and the light-emission intensity obtained by the photoluminescence measurement method, when a conventional GaN-HEMT (the AlGaN layer and the GaN layer thereof) was used as the detection sample. Here, the horizontal axis represents the light-emission wavelength (nm) and the vertical axis represents the light-emission intensity (relative value). Further, there is shown some noise in FIG. 3.

For the AlGaN layer and the GaN layer, light-emission intensities for light-emission wavelengths of the applied light are defined by their energy levels. When 2-dimension electron gas is captured in traps in the GaN layer, this will cause light emission at light-emission intensities different from the defined light-emission intensities.

In the GaN layer including a large amount of Ga holes and carbon, there are formed traps called as deep energy levels. The carbon is generally included in the methyl group of the Ga material for the GaN layer. When the GaN layer includes many traps, electrons will be captured in the traps at the start of the power-operation (at the time of inputting), which will cause the position of the Fermi surface in the GaN layer to be biased toward the conduction band. This will decrease 2-dimension electron gas, thereby decreasing the bias-point current. A GaN layer containing a large amount of Ga holes and carbon generates a high light-emission intensity in the 500-600 nm band (so-called yellow luminescence), based on the relation with the band gap of GaN, because of the aforementioned traps, as illustrated in FIG. 3. The detection sample used for the photoluminescence measurement in FIG. 3 exhibited a Ga-hole concentration of $3\times10^{18}/cm^3$ and a carbon concentration of $2\times10^{18}/cm^3$, both of which were large values. Therefore, by employing a GaN layer which exhibits a low light-emission intensity in the 500-600 nm band as the electron transit layer, it is possible to decrease 2-dimension electron gas captured in traps and shorten the current-drift restoring time, thereby alleviating degradation with a lapse of time in the output value of the GaN-HEMT.

Figure 4:
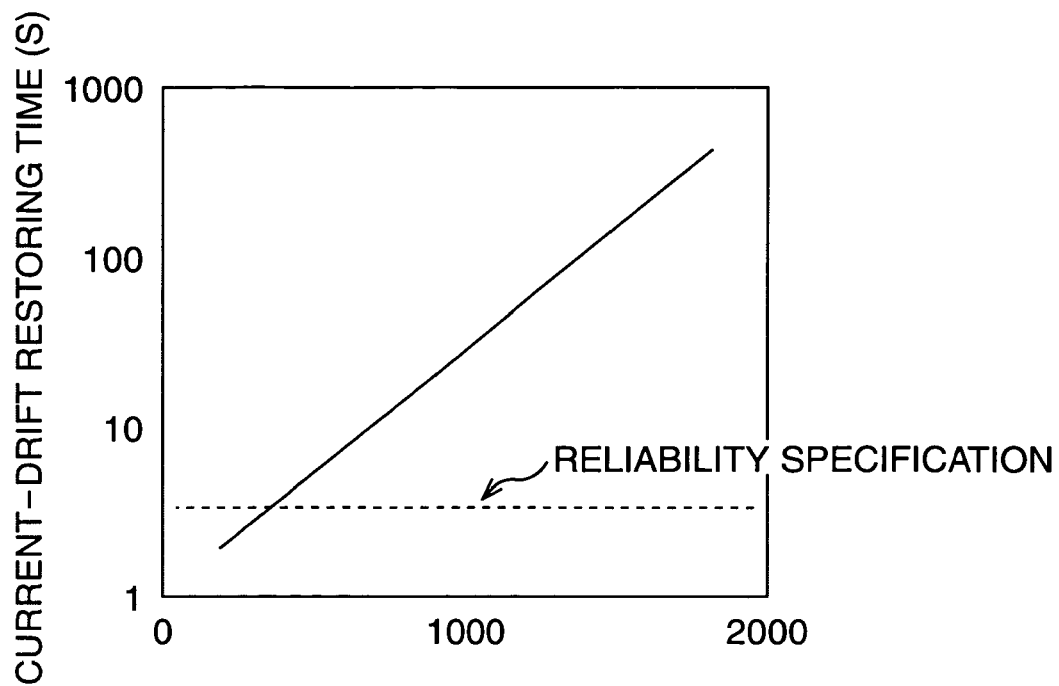
FIG. 4 is a characteristic view illustrating the relationship between the light-emission peak intensity (relative value) in the 500-600 nm band and the current-drift restoring time (second).

The present inventor has studied about the relationship between the light-emission peak intensity (relative value) in the 500-600 nm band and the current-drift restoring time (second) and has found that there is approximately a proportional relationship therebetween, as illustrated in FIG. 4.

From the result in FIG. 4, a light-emission peak intensity in the 500-600 nm band which corresponds to the restoring time satisfying the aforementioned reliability specification was converted into a value relating to the light-emission intensity at the GaN-band edge which exhibits substantially a constant value regardless of the amount of contained Ga holes and carbon. Thus, the A/B ratio was about 0.2, where "A" is the maximum light-emission intensity value in the 500-600 nm band, and "B" is the light-emission intensity at the GaN band-edge. Therefore, it is desirable to employ a GaN layer which exhibits A/B ratio described above of 0.2 or less, as the electron transit layer in the GaN-HEMT. The excitation condition for the photoluminescence measurement was an excitation condition adjusted to maximize the light emission in the 500 nm range under weak excitation conditions and was not a strong excitation condition such as those for use in laser diode measurements.

In order to form a GaN layer which exhibits an aforementioned A/B ratio of 0.2 or less, the amount of contained Ga holes and carbon can be adjusted. More specifically, the amount of Ga holes can be adjusted to a value within the range of $1\times10^{12}/cm^3$ to $1\times10^{18}/cm^3$ and the carbon concentration can be adjusted to a value within the range of $1\times10^{13}/cm^3$ to $1\times10^{18}/cm^3$. The upper limit value for the amount of Ga holes ($1\times10^{18}/cm^3$) and the upper limit value for carbon ($1\times10^{18}/cm^3$) were determined for the reason that greater amounts of Ga holes and carbon than these values will increase the light-emission intensity in the 500-600 nm band, thus preventing the aforementioned ratio condition from being satisfied. The lower limit value for the amounts of Ga holes ($1\times10^{12}/cm^3$) and the lower limit value for carbon ($1\times10^{13}/cm^3$) are determined for the reason that the amounts of Ga holes and carbon will unavoidably become higher than these values, due to factors caused by Ga material, etc.

As a concrete adjusting method for reducing the amount of Ga holes and the carbon concentration, in the case of utilizing a MOVPE process for growing the GaN layer as the electron transit layer, the Ga material is reduced and the growing rate of the GaN is decreased while the high resistivity of the GaN is maintained, since the amount of Ga holes can be decreased when the carbon concentration is decreased, in considering that carbon is included in the methyl group in the Ga material as previously described. For example, the growing rate of the GaN is preferably within the range of 0.1 nm/second to 1 nm/second. If the growing rate is greater than 1 nm/second, the carbon concentration can not be sufficiently reduced. Growing rates lower than 0.1 nm/second will induce a problem in terms of the mass productivity. Further, in this case, in order to reduce the Ga material, the mol ratio of the N material which is, for example, $NH_3$ to the Ga material (the mol number of N/ the mol number of Ga), so-called a V/III ratio, is set to a value within the range of 10000 to 100000. If the V/III ratio is lower than 10000, the carbon concentration can not be sufficiently reduced. If the V/III ratio is higher than 100000, this will cause a problem of difficulty in the treatment of $NH_3$ after use. Thus, by setting the GaN growing rate and the V/III ratio in forming the GaN layer, the A/B ratio, where "A" is the maximum light-emission intensity value in the 500-600 nm band and "B" is the light-emission intensity at the GaN band-edge, can be controlled to about 0.2 or less, thereby enabling significant reduction in the current-drift restoring time.

Also, the present inventor has found that traps for 2-dimension electron gas are formed in the AlN layer which is grown directly on the substrate. Namely, when the AlN layer has a large thickness greater than 100 nm, for example, or a high oxygen concentration higher than $1\times10^{19}/cm^3$, for example, there will be formed traps in the AlN layer. This is because oxygen is easily bound to Al and the Al material contains oxygen. The lower limit for the thickness of the AlN layer is set to 10 nm for the reason that excessively small thicknesses of the AlN layer will prevent the AlN layer from being a flat film since AlN grows laterally at first as will be described later. The lower limit for the oxygen concentration in the AlN layer is set to $1\times10^{13}/cm^3$ since excessively low oxygen concentrations cause traps to be formed in the AlN layer. From the above consideration, the present invention controls the thickness of the AlN layer to a value within the range of 10 nm to 100 nm and also controls the oxygen concentration in the AlN layer to a value within the range of $1\times10^{13}/cm^3$ to $1\times10^{19}/cm^3$.

Figure 5:
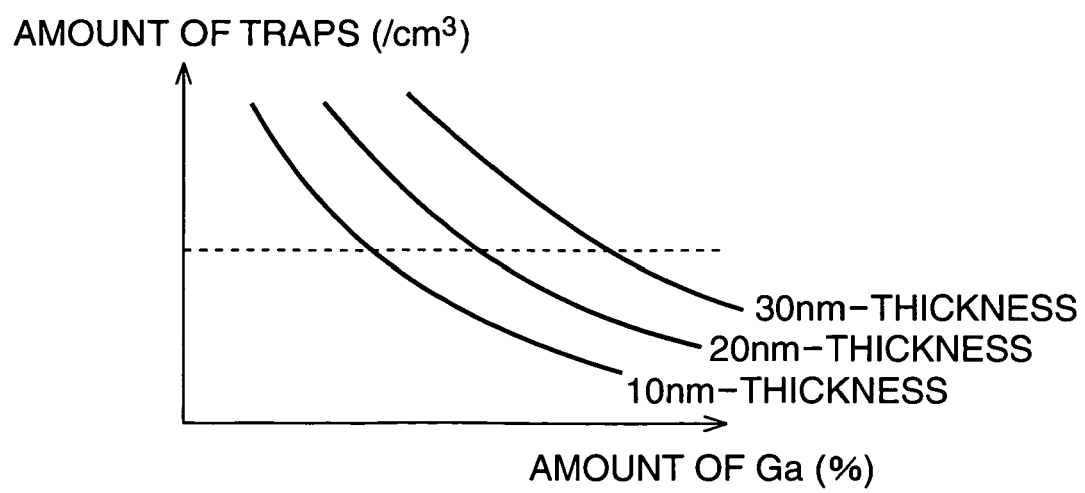
FIG. 5 is a characteristic view illustrating the relationship between the amount (%) of Ga within the AlN layer and the amount (/cm$^3$) of traps within the AlN layer.

Further, the present inventor has found that the oxygen concentration in the AlN layer is decreased by mixing Ga in the AlN layer. FIG. 5 illustrates the relationship between the amount (%) of Ga within the AlN layer and the amount ($/cm^3$) of traps within the AlN layer.

Here, by varying the thickness of the AlN layer, the amount of Ga which causes the amount of traps to be the permissible maximum amount illustrated by the dot line increases with increasing thickness of the AlN layer. Considering that the oxygen concentration within the AlN layer is to be controlled to a value within the range of $1\times10^{13}/cm^3$ to $1\times10^{19}/cm^3$ and that the thickness of the AlN layer is to be controlled to a value within the range of 10 nm to 100 nm, it is preferable that Ga is interfused in the AlN layer with a concentration within the range of 1% to 80%.

However, only by simply defining the GaN growing rate and the V/III ratio as previously described, a large amount of Si will be interfused in the GaN layer, thereby causing the GaN layer to be n-typed. This may adversely affect the operation of the GaN-HEMT.

The N material which is, for example, $NH_3$, includes a large amount of Si. A SiC coating is applied to susceptors for holding a wafer used as the substrate. Therefore, during the growth of the GaN layer, Si will be unavoidably interfused therein. In the case of using a MOVPE process for growing and forming the AlN layer and the GaN layer, these layers will grow laterally at first and then will grow upwardly after some amount of thickness is accumulated. During the phase of the lateral growth, Si contained in the N material and Si contained in the SiC coating on the susceptors will be interfused therein and, after some amount of thickness has been accumulated, they will be hardly interfused therein. Namely, Si will be introduced to lower portions of the respective layers during the initial growth and formation phases of the respective layers. The present invention utilizes that Al incorporated in the GaN layer alleviates interfusion of Si therein, in addition to that Si is introduced to lower portions of the respective layers during the initial growth phases. Namely, in growing and forming the GaN layer, an AlGaN layer including a small amount of Al, as, so to say, an initial layer of the GaN layer, is formed on the AlN layer, and then the GaN layer as the electron transit layer is subsequently formed on the AlGaN layer. This can significantly reduce Si introduced into the GaN layer, thereby providing a non-doped GaN layer with high resistivity. More specifically, for the AlGaN layer with a composition of $Al_xGa_{(1-x)}N$, x is set to a value of 0<x<0.3. If x=0, the effect of alleviating interfusion of Si can not be provided. If x≧0.3, the layer will become approximately equivalent to an AlN layer, resulting in inconvenience. It is preferable that the AlGaN layer which has been formed has a Si concentration within the range of $1\times10^{13}/cm^3$ to $1\times10^{16}/cm^3$. If the Si concentration is higher than $1\times10^{16}/cm^3$, there is not provided the effect of alleviating interfusion of Si. It is considered impossible to cause the Si concentration to be lower than $1\times10^{13}/cm^3$, because of factors caused by the N material, etc., and the limitations of measurements.

Here, the thickness of the AlGaN layer is an important factor of suppression of Si interfused in the GaN layer. In the present invention, the AlGaN layer is formed to a thickness within the range of 10 nm to 200 nm. If the thickness is smaller than 10 nm, the layer will not be a flat film. If the thickness is greater than 200 nm, traps will be formed in the film.

Further, in order to suppress interfusion of Si in the GaN layer, the growing temperature during the formation of the GaN layer is set to a low temperature, and, in this case, to a value within the range of from 1000° C. to 1100° C. If the growing temperature is set to a value lower than 1000° C., this will lead to increase in the carbon concentration within the GaN layer. If the growing temperature is set to a value higher than 1100° C., this will facilitate interfusion of Si. At this time, it is preferable to define the growing pressure, as well as the growing temperature, during the formation of the GaN layer. More specifically, in order to aid the low growing temperature, it is preferable to set the growing pressure to a value within the range of from $6.7\times10^3$ Pa (50 torr) to $4.0\times10^4$ Pa (300 torr). It is not realistic to set the growing pressure to below $6.7\times10^3$ Pa, while growing pressures higher than $4.0\times10^4$ Pa hinder temperature reduction in the growing.

A Concrete Embodiment Utilizing the Present Invention (The Configuration of the GaN-HEMT)

Based on the aforementioned basic skeleton of the present invention, the configuration of a GaN-HEMT according to the present embodiment will be explained.

Figure 6:
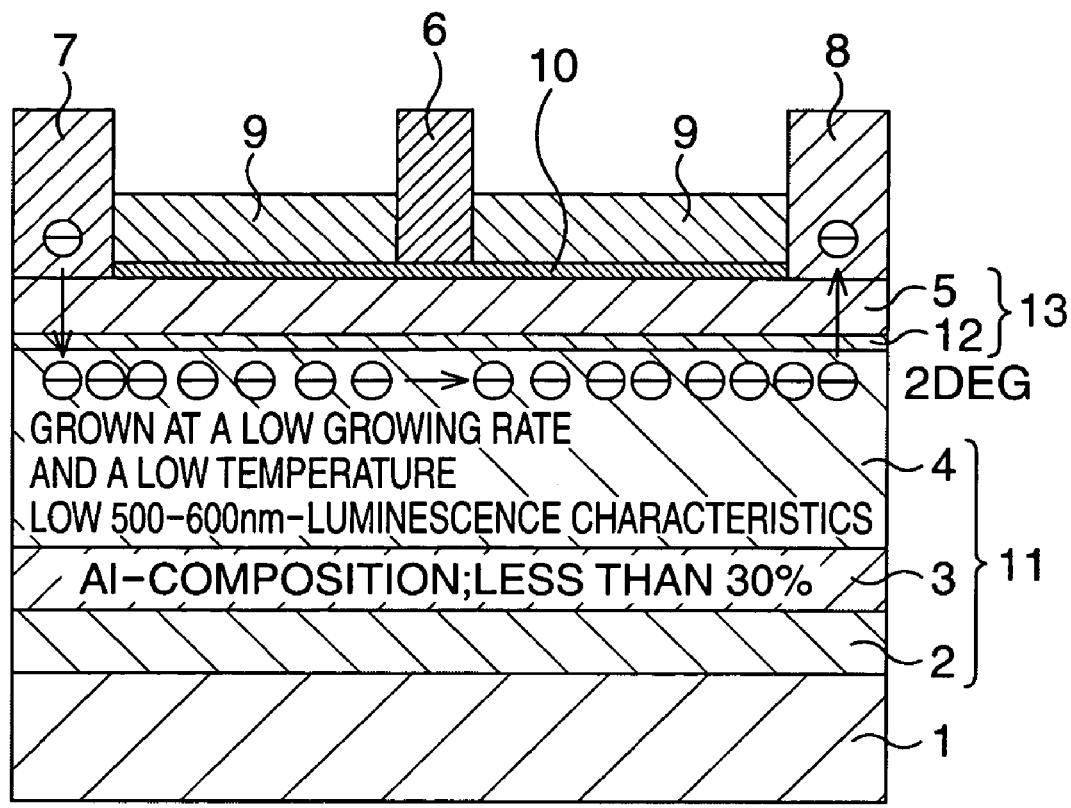
FIG. 6 is a schematic cross sectional view illustrating the configuration of the GaN-HEMT according to the present embodiment.

FIG. 6 is a schematic cross sectional view illustrating the configuration of the GaN-HEMT according to the present embodiment.

In the GaN-HEMT, a buffer layer 11 including an electron transit layer, an AlGaN layer 13 serving as an electron supply layer and an n-type GaN layer 10 are laminated on a substrate formed from sapphire, SiC, GaN, Si, etc., and, in this case, a SiC substrate 1. Then, a gate electrode 6 is formed with pattern formation on the GaN layer 10. A source electrode 7 and a drain electrode 8 are formed with pattern formation such that they are spaced apart from the both sides of the gate electrode 6. A SiN layer 9, as a protective insulating film, is laminated between the source electrode 7 and the drain electrode 8 on the n-type GaN layer 10, and thus the GaN-HEMT is configured.

The buffer layer 11 is configured by continuously laminating and growing an AlN layer 2, an AlGaN layer 3 and a GaN layer 4.

The AlN layer 2 has a thickness within the range of 10 nm to 100 nm and, in this case, has a thickness of about 20 nm and the oxygen concentration thereof is held within the range of $1\times10^{13}/cm^3$ to $1\times10^{19}/cm^3$. Ga may be interfused in the AlN layer 2 with a ratio within the range of 1% to 80%, and, for example, a ratio of about 50%. This may decrease the oxygen concentration to, for example, about $1\times10^{18}/cm^3$, and may further improve the current-drift restoring time.

The AlGaN layer 3 is provided in order to suppress interfusion of Si in the GaN layer 4 during the growth of the GaN layer 4. The AlGaN layer 3 has a thickness within the range of 10 nm to 200 nm and, in this case, has a thickness of about 30 nm. Further, the AlGaN layer 3 has a Si concentration below $1\times10^{16}/cm^3$, and in this case, has a Si concentration of about $(5\times10^{14})/cm^3$. Here, the AlGaN layer 3 is intended to have a low Al-composition ratio and, in $Al_xGa_{(1-x)}N$, x is of a value of 0<x<0.3 and, for example, x is 0.05. By forming the AlGaN layer 3 as, so to say, an initial layer for the GaN layer 4, between the AlN layer 2 and the GaN layer 4, as previously described, Al in the AlGaN will suppress interfusion of Si during the lateral growth of the AlGaN.

Also, as a layer for suppressing interfusion of Si, an AlGaInN layer may be formed instead of the AlGaN layer 3. By forming an AlGaInN layer including In, there will be provided an effect of suppressing interfusion of Si. In this case, in $Al_x[Ga_yIn_{(1-y)}]_{(1-x)}N$, x is of a value of 0<x<0.3 and y is of a value of 0<y<0.1, for example.

The GaN layer 4 functions as an electron transit layer and is formed such that, at least at one portion thereof, the A/B ratio becomes 0.2 or less obtained by photoluminescence measurement, where "A" is the maximum light-emission intensity value in the 500-600 nm band, and "B" is the light-emission intensity at the GaN band-edge. In this case for example, it is about 0.16. The excitation condition for the photoluminescence measurement is an excitation condition adjusted to maximize the light emission in the 500 nm range in weak excitation conditions and is not a strong excitation condition such as those used for laser diode measurements.

The thickness of the GaN layer 4 is set to a value within the range of 500 nm to 5000 nm, and, in this case, to about 1000 nm. With this configuration, the current-drift restoring time shows a value which sufficiently satisfies the aforementioned reliability specification. This is because the amount of Ga holes and the carbon concentration are held to low values. More specifically, the amount of Ga holes in the GaN layer 4 is held within the range of $1\times10^{12}/cm^3$ to $1\times10^{18}/cm^3$, and, for example, at a value of $1\times10^{14}/cm^3$. The carbon concentration thereof is held within the range of $1\times10^{13}/cm^3$ to $1\times10^{18}/cm^3$ and, for example, at a value of $2\times10^{14}/cm^3$. Further, the Si concentration of the GaN layer 4 is held at a low value of, for example, $1\times10^{14}/cm^3$.

The AlGaN layer 13 functions as an electron supply layer and is configured by laminating a non-doped AlGaN layer 12 with a thickness of about 3 nm and an n-type AlGaN layer 5 with a thickness of about 20 nm. The n-type AlGaN layer 5 is formed by doping with Si to a concentration of, for example, about $4\times10^{18}/cm^3$.

The n-type GaN layer 10 is for suppressing changes in the on-resistance during operation, called as current collapse, and is formed by doping with Si to a concentration of, for example, about $5\times10^{18}/cm^3$.

The gate electrode 6 is formed by laminating Ni/Au in order and is Schottky-connected to the n-type GaN layer 10.

The source electrode 7 and the drain electrode 8 are formed by laminating Ti/Al in order, and are ohmic-connected to exposed portions of the surface of the n-type AlGaN layer 5 from which the n-type GaN layer 10 has been removed such that they are spaced apart from the right and left sides of the gate electrode 6.

The SiN layer 9 is a protective insulating film formed between the gate electrode 6 and the source electrode 7 and between the gate electrode 6 and the drain electrode 8 and has a function of suppressing current collapse in cooperation with the n-type GaN layer 10.

With the GaN-HEMT according to the present embodiment, by controlling the gate voltage applied to the gate electrode 6, 2-dimension electron gas moves between the source electrode 7 and the drain electrode 8 through the GaN layer 4 as the electron transit layer, and this movement generates predetermined outputs. As previously described, in the GaN-HEMT according to the present embodiment, traps will be hardly formed in the AlN layer 2, etc., as well as in the GaN layer 4, and therefore 2-dimension electron gas beneath the gate electrode 6 will not be decreased. Thus, the current-drift restoring time can be shortened to below the reliability specification, thereby holding the degradation with a lapse of time of the output value to 5% or less of the initial value after continuous use for 15 years.

(Fabricating Method of the GaN-HEMT)

Based on the aforementioned basic skeleton of the present invention, the fabricating method of the GaN-HEMT according to the present embodiment will be explained.

Figure 7A:
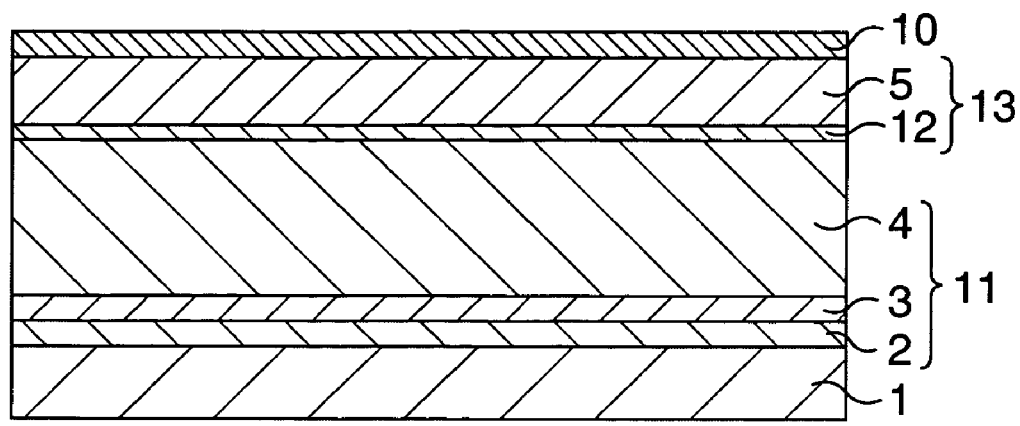
FIGS. 7A and 7B are schematic cross sectional views illustrating the fabricating method of the GaN-HEMT according to the present embodiment, in order of the process steps.
Figure 7B:
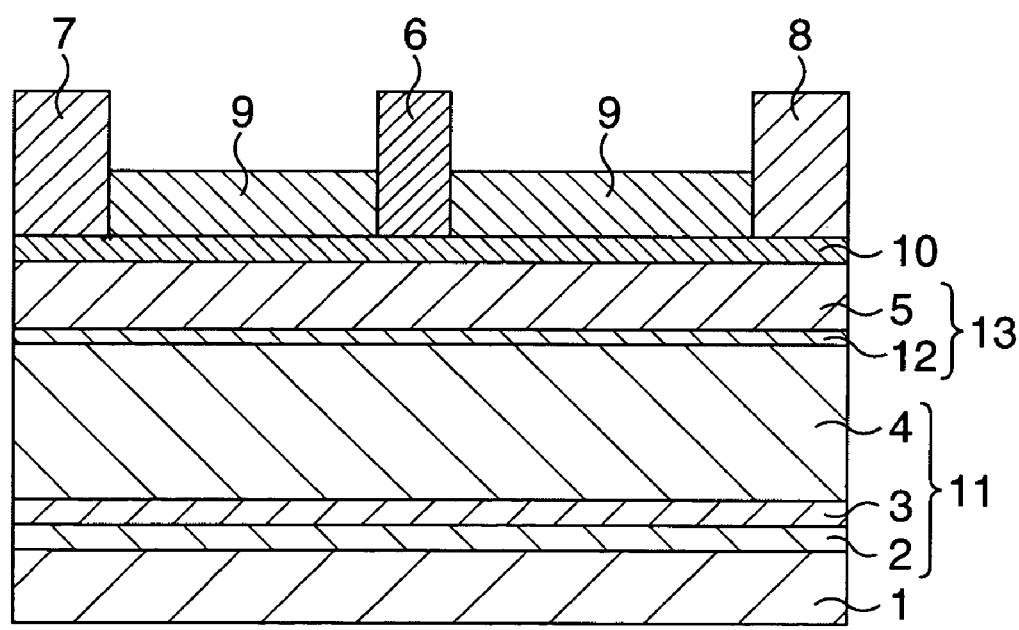

FIGS. 7A and 7B are schematic cross sectional views illustrating the fabricating method of the GaN-HEMT according to the present embodiment, in order of the process steps.

At first, as illustrated in FIG. 7A, a SiC substrate 1 is prepared and, on the SiC substrate 1, an AlN layer 2, an AlGaN layer 3 and a GaN layer 4 constituting a buffer layer 11, a non-doped AlGaN layer 12 and an n-type AlGaN layer 5 constituting an AlGaN layer 13, and an n-type GaN layer 10 are continuously grown and formed in order, with MOVPE processes. The method for growing these layers is not limited to MOVPE processes and may be, for example, MBE processes.

More specifically, an AlN layer 2 with a thickness of about 20 nm, an AlGaN layer 3 with a thickness of about 30 nm and an Al composition ratio of about 5% on the AlN layer 2, a GaN layer 4 with a thickness of about 1000 nm on the AlGaN layer 3, a non-doped AlGaN layer 12 with a thickness of about 3 nm on the GaN layer 4, and an n-type AlGaN layer 5 having a thickness of about 20 nm and doped with Si with a concentration of about $4 \times 10^{18}/cm^3$ on the non-doped AlGaN layer 12 and an n-type GaN layer 10 having a thickness of about 5 nm and doped with Si with a concentration of about $4 \times 10^{18}/cm^3$ on the n-type AlGaN layer 5 are grown sequentially in order.

Particularly, in growing and forming the GaN layer 4, respective conditions of the MOVPE processes are restricted in order to satisfy the requirement (Requirement 1) of forming the GaN layer 4 such that the aforementioned A/B ratio obtained from photoluminescence measurements shows a value of 0.2 or less, and, in this case, about 0.2 and also the requirement (Requirement 2) of reducing Si interfused in the GaN layer 4 in cooperation with the AlGaN layer 3.

More specifically, the growing rate, the V/III ratio, the growing temperature, and the growing pressure for the GaN layer 4 are adjusted. Here, the former two, or the growing rate and the V/III ratio are conditions for satisfying Requirement 1 of holding the aforementioned A/B ratio obtained from photoluminescence measurements to 0.2 or less and, therefore, shortening the current-drift restoring time, thereby reducing the degradation with a lapse of time of the GaN-HEMT. On the other hand, the latter two, or the growing temperature and the growing pressure are conditions for satisfying Requirement 2 of suppressing increases of interfusion of Si, which would occur only by setting the aforementioned former two conditions.

The growing rate is set to a low value within the range of 0.1 nm/second to 1 nm/second, and, in this case, to 0.5 nm/second. The V/III ratio is set to a high value within the range of 10000 to 100000 and, in this case, to about 80000. The growing temperature is set to a low temperature within the range of from 1000° C. to below 1100° C. and, in this case, to 1045° C. The growing pressure is set to a low pressure within the range of from $6.7 \times 10^3$ Pa (50 torr) to $4.0 \times 10^4$ Pa (300 torr) and, in this case, to $1.3 \times 10^4$ Pa (100 torr).

Then, as illustrated in FIG. 7B, the gate electrode 6, the source electrode 7, the drain electrode 8 and the SiN layer 9 are formed respectively.

At first, the source electrode 7 and the drain electrode 8 are formed by pattern formation.

By lithography and subsequent dry etching, the portions of the n-type GaN layer 10 at which the source electrode 7 and the drain electrode 8 are to be formed are removed to expose the surface of the N-type AlGaN layer 5 corresponding to the aforementioned portions. Then, by sputtering processes, for example, Ti with a thickness of about 30 nm and Al with a thickness of about 200 nm are laminated in order and then the Ti/Al is subjected to an annealing process at 550° C. for 30 seconds to alloy the Ti/Al. Then, by patterning the Ti/Al into an electrode-shape by lithography and subsequent dry etching such that only the aforementioned portions thereof are left, the source electrode 7 and the drain electrode 8 are formed.

Next, the gate electrode 6 is formed through pattern formation.

By sputtering processes, for example, Ni with a thickness of about 30 nm and Au with a thickness of about 400 nm are laminated in order, and then, by lithography and subsequent dry etching, the Ni/Al is patterned into an electrode shape to form the gate electrode 6.

Then, the SiN layer 9 is formed.

By a plasma CVD process, for example, SiN is deposited to a film thickness which will not bury the gate electrode 6, the source electrode 7 and the drain electrode 8 and, in this case, to a thickness of about 40 nm, to form the SiN layer 9. At this time, as the illustrated example, the SiN on the gate electrode 6, the source electrode 7 and the drain electrode 8 may be removed.

In this connection, the element separation is achieved by predetermined ion implantation.

(Exemplary Experiments)

For the GaN-HEMT configured as described above according to the present embodiment, experiment (Experiment 1) for demonstrating the superiority of the present embodiment over conventional arts in terms of the current-drift restoring time and experiment (Experiment 2) for demonstrating the effect of suppressing interfusion of Si of the GaN-HEMT according to the present embodiment were performed.

(1) Experiment 1

Figure 8:
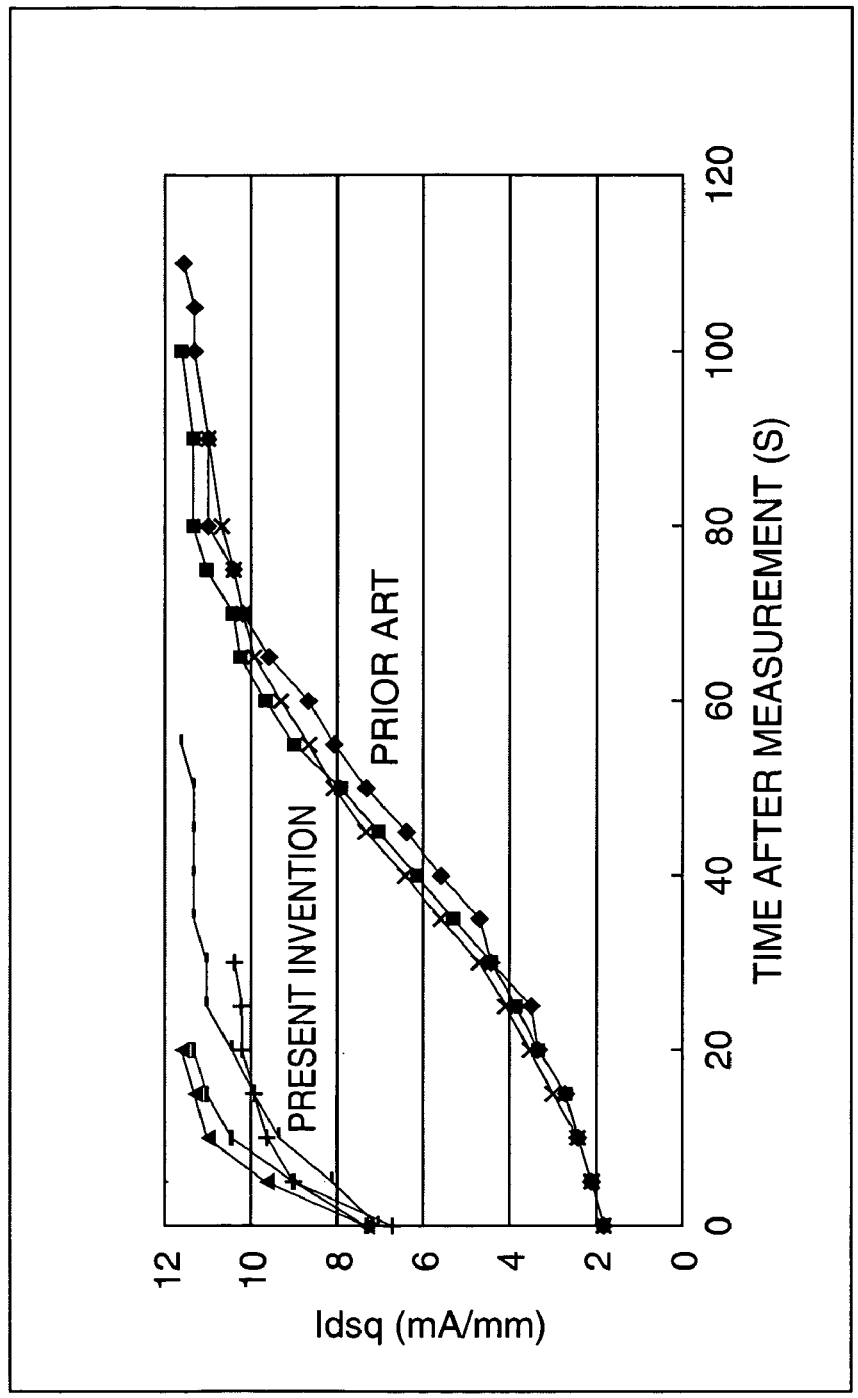
FIG. 8 is a characteristic view illustrating monitored slight drain currents which flowed at the instant of turning off the power-operation of the GaN-HEMT according to the present embodiment.

FIG. 8 illustrates monitored drain currents flowed at the instant of turning off the power-operation, in the GaN-HEMT according to the present embodiment. The horizontal axis represents the measuring time (second) and the vertical axis represents the drain current value (bias-point current: mA/mm) at the instant of turning off the power-operation of the GaN-HEMT. The number of measurements was three. In FIG. 8 there are also illustrated the results of measurements for the conventional GaN-HEMT of FIG. 2. At this time, while in the conventional GaN-HEMT the amount of Ga holes and the carbon concentration in the GaN layer serving as the electron transit layer were high values of $3 \times 10^{18}/cm^3$ and $2 \times 10^{18}/cm^3$, respectively, the amount of Ga holes and the carbon concentration in the GaN layer serving as the electron transit layer, in the GaN-HEMT according to the present embodiment, were $1 \times 10^{14}/cm^3$ and $2 \times 10^{14}/cm^3$, respectively, and these values are both lower compared with those of the conventional GaN-HEMT.

With the conventional GaN-HEMT, as previously described, there was observed a transient response characteristic in which, just after turning off the power operation, the bias-point current decreased to about 10% of the value before the power-operation and it took over one minute to restore that. On the contrary, with the GaN-HEMT according to the present embodiment, just after turning off the power-operation, the bias-point current decreased to about 60% of the value before the power-operation and was restored in a short time interval of about 10 seconds.

Figure 9:
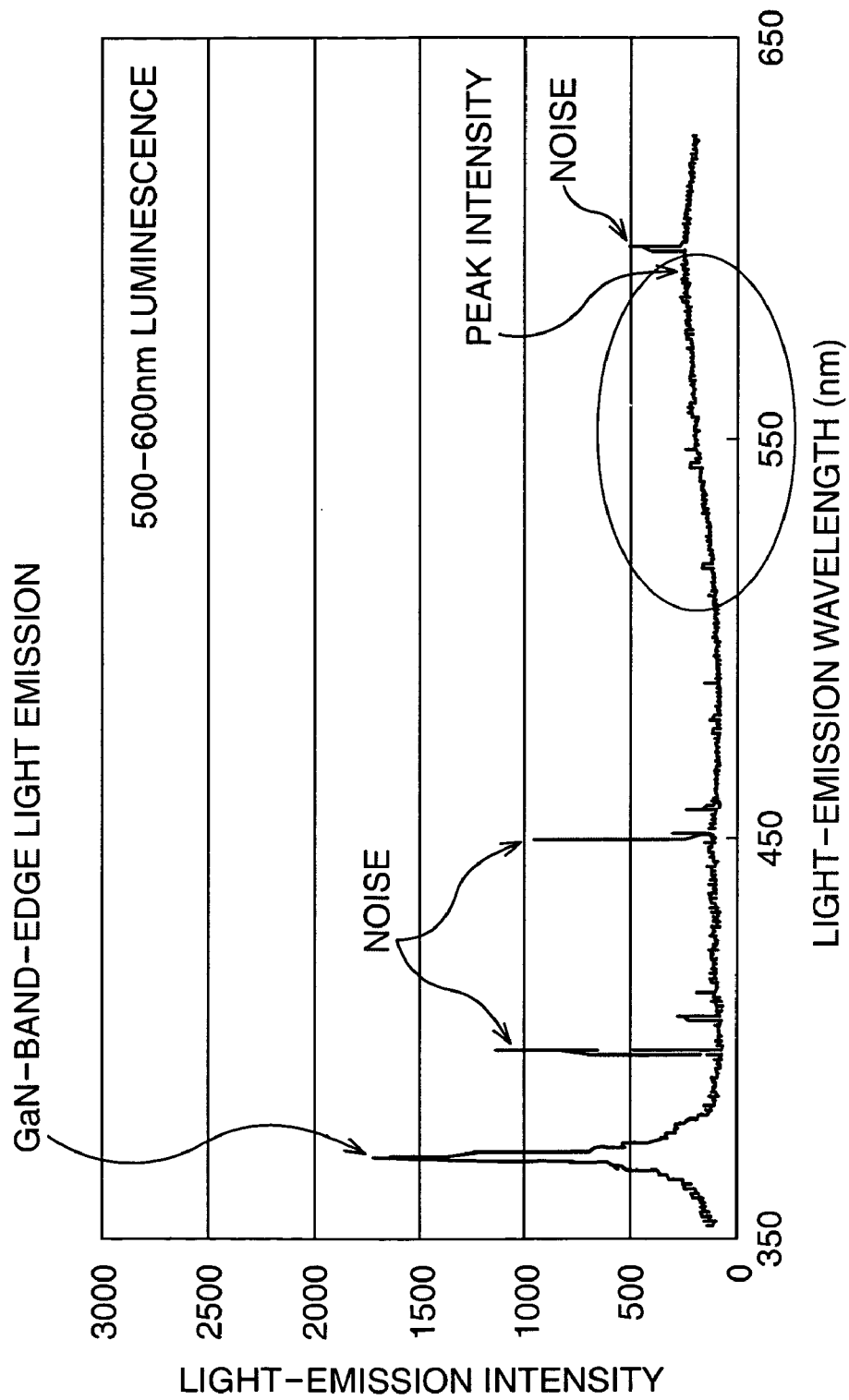
FIG. 9 is a characteristic view illustrating the relationship between the light-emission wavelength and the light-emission intensity obtained by the photoluminescence measurement method, when the GaN-HEMT (the AlGaN layer and the GaN layer thereof) according to the present embodiment of the present invention was used as the detection sample.

FIG. 9 is a characteristic view illustrating the relationship between the light-emission wavelength and the light-emission intensity in the case of using the GaN-HEMT (the AlGaN layer and the GaN layer therein) according to the present embodiment as the detection sample, which was obtained by photoluminescence measurements. FIG. 9 corresponds to FIG. 3 for the conventional GaN-HEMT (the AlGaN layer and the GaN layer therein) used as the detection sample. Here, the horizontal axis represents the light-emission wavelength (nm) and the vertical axis represents the light-emission intensity (relative value). Further, there is also illustrated some noise in FIG. 9.

As can be seen from FIGS. 9 and 3, the GaN-HEMT according to the present embodiment generated the maximum light-emission intensity value in the 500-600 nm band which was about one-eighth the light-emission intensity in the 500-600 nm band generated from the conventional GaN-HEMT, and there were also obtained other results of experiments which showed that this ratio was about one-tenth. At this time, with the conventional GaN-HEMT, the A/B ratio is a high value of about 1.2, where "A" is the maximum light-emission intensity value in the 500-600 nm band, and "B" is the light-emission intensity at the GaN band-edge. On the other hand, with the GaN-HEMT according to the present embodiment, the aforementioned A/B ratio is 0.2 or less and, in this case, about 0.16. The excitation condition for the photoluminescence measurement was an excitation condition adjusted to maximize the light emission in the 500 nm range in weak excitation conditions and was not a strong excitation condition such as those used for laser diode measurements.

As previously described using FIG. 4, there is a proportional relationship between the light-emission peak intensity in the 500-600 nm band and the current-drift restoring time. Therefore, the extremely-short current-drift restoring time of the GaN-HEMT according to the present embodiment is indicated from a low light-emission peak intensity in the 500-600 nm band.

Figure 10:
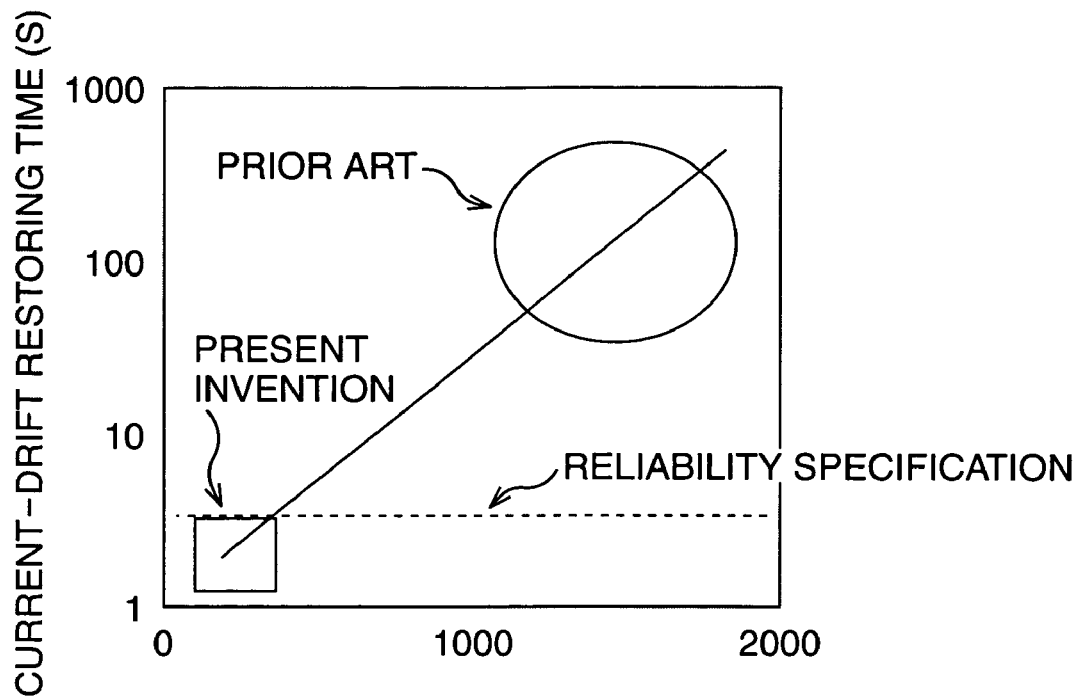
FIG. 10 is a characteristic view illustrating the relationship between the light-emission peak intensity (relative value) in the 500-600 nm band and the current-drift restoring time (second), for the GaN-HEMT according to the present embodiment, based on comparison with the conventional GaN-HEMT.

FIG. 10 illustrates the relationship between the light-emission peak intensity (relative value) in the 500-600 nm band and the current-drift restoring time (second), for the GaN-HEMT according to the present embodiment, based on comparison with the conventional GaN-HEMT. FIG. 10 corresponds to FIG. 4.

While the conventional GaN-HEMT exhibits a long restoring time which largely deviates from the reliability specification, the GaN-HEMT according to the present embodiment exhibits a short restoring time which sufficiently satisfies the reliability specification.

(2) Experiments 2

For the GaN-HEMT (the AlGaN layer and the GaN layer therein) according to the present embodiment, element separation characteristics were inspected and, as a result, there was found no problem.

As a comparative example with the present embodiment, the GaN layer serving as the electron transit layer was formed at a growing temperature of 1100° C. As a result, the Si concentration in the GaN layer became a high value of $2 \times 10^{16}/cm^3$ and thus the element separation characteristics was degraded by four orders of magnitude as compared with that of the present embodiment, and the FET characteristics exhibited no pinch-off. Therefore, it was found that, in order to hold the Si concentration of the GaN layer at a low value, it is necessary to set the growing temperature to below 1100° C.

Further, as illustrated in FIG. 11, when an AlGaN layer with a low Al-composition ratio was not formed between the AlN layer and the GaN layer, the element separation characteristics was degraded by two orders of magnitude as compared with that of the present embodiment. Therefore, the fact showed that, in order to achieve a short restoring time which sufficiently satisfies the reliability specification and also hold the Si concentration of the GaN layer at a low value, it is necessary to form an AlGaN layer with a low Al composition ratio between the AlN layer and the GaN layer.

As described above, according to the present embodiment, there is realized a highly reliable GaN-HEMT which exhibits extremely small variations in the characteristics and small degradation with a lapse of time. This GaN-HEMT can provide highly reliable characteristics required for amplifiers for portable-phone base-stations and provides significant effects of contributing to development in the market for electronic devices employing GaN.

According to the present invention, there is realized a highly reliable compound semiconductor device which exhibits extremely small variations in the characteristics and small degradation with a lapse of time. This compound semiconductor device can provide highly reliable characteristics required for base-station amplifiers for portable-phone and provides a significant effect of contributing to development in the market for electronic devices using GaN.

What is claimed is:

1. A compound semiconductor device having a transistor configuration comprising:
    a substrate;
    a buffer layer formed on the substrate; and
    an electron supplying layer containing AlGaN formed on the buffer layer;
    wherein the buffer layer having a first buffer layer containing AlN formed on the substrate, a third buffer layer containing AlGaN formed on the first buffer layer, a second buffer layer containing GaN formed on the third buffer layer, the third buffer layer having a thickness within the range of 10 nm to 200 nm and formed to directly contact with the first buffer layer and the second buffer layer; and
    wherein an amount of Ga holes is within the range of $1 \times 10^{12}/cm^3$ to $1 \times 10^{18}/cm^3$ and a carbon concentration is within the range of $1 \times 10^{13}/cm^3$ to $1 \times 10^{18}/cm^3$ in the second buffer layer.

2. The compound semiconductor device according to claim 1, wherein the third buffer layer comprises $Al_xGa_{(1-x)}N$, x being of the value of $0 < x < 0.3$.

3. The compound semiconductor device according to claim 1, wherein the first buffer layer has a thickness within the range of 10 nm to 100 nm.

4. The compound semiconductor device according to claim 1, wherein a Ga concentration in the first buffer layer is within the range of 1% to 80%.

5. The compound semiconductor device according to claim 1, wherein an oxygen concentration in the first buffer layer is within the range of $1 \times 10^{13} cm^3/cm^3$.

6. The compound semiconductor device according to claim 1, wherein a Si concentration in the third buffer layer is equal to or less than $1 \times 10^{16}/cm^3$.

7. The compound semiconductor device according to claim 1, further including a n-type GaN layer formed on the electron supplying layer containing AlGaN.

* * * * *

UNITED STATES PATENT AND TRADEMARK OFFICE
CERTIFICATE OF CORRECTION

PATENT NO.        : 7,638,819 B2                                                   Page 1 of 1
APPLICATION NO.   : 11/181730
DATED             : December 29, 2009
INVENTOR(S)       : Kikkawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 145 days.

Signed and Sealed this

Twenty-first Day of December, 2010

David J. Kappos
*Director of the United States Patent and Trademark Office*